United States Patent
Jung et al.

(10) Patent No.: US 8,999,748 B2
(45) Date of Patent: Apr. 7, 2015

(54) ORGANIC THIN FILM TRANSISTOR AND METHOD OF MANUFACTURING THE SAME

(71) Applicant: Samsung Electronics Co., Ltd., Suwon-si, Gyeonggi-Do (KR)

(72) Inventors: Ji-Young Jung, Seoul (KR); Joo-Young Kim, Hwaseong-si (KR); Hyeok Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 3 days.

(21) Appl. No.: 13/670,001

(22) Filed: Nov. 6, 2012

(65) Prior Publication Data
US 2013/0292650 A1   Nov. 7, 2013

(30) Foreign Application Priority Data
May 4, 2012   (KR) .................. 10-2012-0047548

(51) Int. Cl.
H01L 51/40 (2006.01)
H01L 29/08 (2006.01)
H01L 51/00 (2006.01)
H01L 51/05 (2006.01)
H01L 51/10 (2006.01)

(52) U.S. Cl.
CPC ........ *H01L 51/0004* (2013.01); *H01L 51/0533* (2013.01); *H01L 51/102* (2013.01)

(58) Field of Classification Search
CPC ............ H01L 27/1214; H01L 27/1251; H01L 27/3248; H01L 27/3251; H01L 27/3258; H01L 27/3274; H01L 29/4908; H01L 51/0508; H01L 2021/775; H01L 2924/13069
USPC .............. 257/40, 43, 712, 64, 49, 66; 438/99, 438/149, 158, 21, 141, 151, 29, 637, 497, 438/758
See application file for complete search history.

(56) References Cited

U.S. PATENT DOCUMENTS

2007/0194386 A1*   8/2007   Hahn et al. .................... 257/368
2007/0267630 A1*   11/2007   Izumi et al. ...................... 257/40
(Continued)

FOREIGN PATENT DOCUMENTS

| JP | 2007311677 A | 11/2007 |
|---|---|---|
| KR | 20080040119 A | 5/2008 |

(Continued)

*Primary Examiner* — Selim Ahmed
*Assistant Examiner* — Moin Rahman
(74) *Attorney, Agent, or Firm* — Harness, Dickey & Pierce, P.L.C.

(57) ABSTRACT

According to example embodiments, a method of manufacturing an organic thin film transistor includes sequentially forming a gate electrode, a gate insulator, a source electrode, and a drain electrode on a substrate, forming a first self-assembled monolayer on the source electrode and the drain electrode from a first self-assembled monolayer precursor, forming a second self-assembled monolayer on the gate insulator from a second self-assembled monolayer precursor that is different from the first self-assembled monolayer precursor, and forming an organic semiconductor on the first self-assembled monolayer and the second self-assembled monolayer. The first self-assembled monolayer and the second self-assembled monolayer may be formed simultaneously or sequentially in a single container. An organic thin film transistor may be manufactured according to the method. A display device may include the organic thin film transistor.

15 Claims, 13 Drawing Sheets

(56) References Cited

U.S. PATENT DOCUMENTS

| | | | |
|---|---|---|---|
| 2008/0067504 A1* | 3/2008 | Park et al. | 257/40 |
| 2008/0105866 A1 | 5/2008 | Jeong et al. | |
| 2009/0155964 A1* | 6/2009 | Chang et al. | 438/197 |
| 2010/0065830 A1* | 3/2010 | Kim et al. | 257/40 |
| 2011/0027532 A1 | 2/2011 | Schmidt et al. | |

FOREIGN PATENT DOCUMENTS

| | | |
|---|---|---|
| KR | 20100032654 A | 3/2010 |
| KR | 20100093362 A | 8/2010 |

* cited by examiner

ORGANIC THIN FILM TRANSISTOR AND METHOD OF MANUFACTURING THE SAME

This application claims priority under 35 U.S.C. §119 to Korean Patent Application No. 10-2012-0047548, filed in the Korean Intellectual Property Office on May 4, 2012, the entire contents of which are incorporated herein by reference.

BACKGROUND

1. Field

Example embodiments relate to an organic thin film transistor and/or a method of manufacturing the same.

2. Description of the Related Art

A flat panel display such as a liquid crystal display (LCD), an organic light emitting diode (OLED) display, an electrophoretic display, and the like may include a plurality of field generating electrodes and an active layer interposed therebetween. The liquid crystal display (LCD) includes a liquid crystal layer as the electro-optically active layer, and the organic light emitting diode (OLED) display includes an organic emission layer as the active layer.

One of a pair of field generating electrodes is generally connected to a switching element to receive electric signal, and the active layer converts the electric signal into an optical signal to display images.

The flat panel display uses a three-terminal element of a thin film transistor (TFT) as a switching element, and the flat panel display includes a gate line transferring a scan signal for controlling the thin film transistor and a data line transferring a signal applied to a pixel electrode.

Among the thin film transistors, an organic thin film transistor (OTFT) including an organic semiconductor instead of an inorganic semiconductor such as silicon (Si) has been actively researched.

Since the organic thin film transistor may be formed in a shape of fiber or film considering the organic material characteristics, it has drawn attention for a core element of a flexible display device.

The contact resistance and the channel characteristic between the organic semiconductor and the metal electrode are important to determine the charge transport characteristic in the organic thin film transistor.

SUMMARY

Example embodiments relate to a method of manufacturing an organic thin film transistor having improved channel characteristics and simultaneously decreased contact resistance between an organic semiconductor and a metal electrode by a simple process.

Example embodiments also relate to an organic thin film transistor manufactured according to the above-described method.

According to example embodiments, a method of manufacturing an organic thin film transistor includes: sequentially forming a gate electrode, a gate insulator, a source electrode, and a drain electrode on a substrate; forming a first self-assembled monolayer on the source electrode and the drain electrode from a first self-assembled monolayer precursor; forming a second self-assembled monolayer on the gate insulator from a second self-assembled monolayer precursor, the second self-assembled monolayer being a different material than a material of the first self-assembled monolayer precursor; and forming an organic semiconductor on the first self-assembled monolayer and the second self-assembled monolayer. The forming a first self-assembled monolayer and the forming a second self-assembled monolayer may be simultaneously or sequentially performed in a single container.

The forming a first self-assembled monolayer and the forming a second self-assembled monolayer may include coating a mixed solution of the first self-assembled monolayer precursor and the second self-assembled monolayer precursor on the source electrode, the drain electrode, and the gate insulator.

The coating a mixed solution on the source electrode, the drain electrode, and the gate insulator may include one of dip coating and spin coating.

The mixed solution may include a different concentration of the first self-assembled monolayer precursor than a concentration of the second self-assembled monolayer precursor.

The forming a first self-assembled monolayer and the forming a second self-assembled monolayer may include: coating a first solution including one of the first self-assembled monolayer precursor and the second self-assembled monolayer precursor on the source electrode, the drain electrode, and the gate insulator; and coating a second solution on the source electrode, the drain electrode, and the gate insulator. The second solution may contain an other of the first self-assembled monolayer precursor and the second self-assembled monolayer precursor added to the first solution.

The coating a first solution and a second solution on the source electrode, the drain electrode, and the gate insulator may be performed by a dipping method.

The forming a first self-assembled monolayer and the forming a second self-assembled monolayer may include: coating one of the first self-assembled monolayer precursor and the second self-assembled monolayer precursor on the source electrode, the drain electrode, and the gate insulator; and then coating an other of the first self-assembled monolayer precursor and the second self-assembled monolayer precursor on the source electrode, the drain electrode, and the gate insulator.

The coating the first self-assembled monolayer precursor and the second self-assembled monolayer precursor may be performed by a spin coating method.

The coating a first self-assembled monolayer and the coating a second self-assembled monolayer may include simultaneously providing a vapor of the first self-assembled monolayer precursor and the second self-assembled monolayer precursor on the gate insulator, the source electrode, and the drain electrode.

The coating a first self-assembled monolayer and the coating a second self-assembled monolayer may include providing a vapor of one of the first self-assembled monolayer precursor and the second self-assembled monolayer precursor on the gate insulator, the source electrode, and the drain electrode; and further providing an other of the first self-assembled monolayer precursor and the second self-assembled monolayer precursor in a vapor phase on the gate insulator, the source electrode, and the drain electrode.

The first self-assembled monolayer precursor may include a thiol-based compound, a thioacetyl-based compound, a disulfide-based compound, or a combination thereof.

The first self-assembled monolayer precursor may include a fluorine-containing thiol-based compound.

The second self-assembled monolayer precursor may include a compound represented by the following Chemical Formula 1.

$$X\text{—}Y\text{—}Z \qquad \text{[Chemical Formula 1]}$$

In Chemical Formula 1, X is —SiX$_1$X$_2$X$_3$, —COOH, —SOOH, —PO$_S$H, —SO$_3$H$_2$, —COCl, —PO$_3$H, —SO$_2$Cl, —OPOCl$_2$, —POCl$_2$, or a combination thereof, wherein X$_1$, $X_2$, and $X_3$ are each independently hydrogen, a substituted or unsubstituted C1 to C20 alkoxy group, a hydroxy group, or a halogen atom. Y is —$(CH_2)_n$— (n is an integer of 0 to 30) or —$(CF_2)_m$— (m is an integer of 0 to 30), or a combination thereof. Z is hydrogen, a hydroxy group, a substituted or unsubstituted C1 to C20 alkyl group, a substituted or unsubstituted C6 to C20 aryl group, a substituted or unsubstituted C1 to C20 haloalkyl group, a halogen atom, a thiol group, an amine group, a nitro group, or a combination thereof.

According to example embodiments, an organic thin film transistor may be manufactured according to the foregoing method.

According to example embodiments, a display device may include the organic thin film transistor.

BRIEF DESCRIPTION OF THE DRAWINGS

The foregoing and other features and advantages of example embodiments will be apparent from the more particular description of non-limiting embodiments, as illustrated in the accompanying drawings in which like reference characters refer to the same parts throughout the different views. The drawings are not necessarily to scale, emphasis instead being placed upon illustrating the principles of inventive concepts. In the drawings.

DETAILED DESCRIPTION

Figure 1:
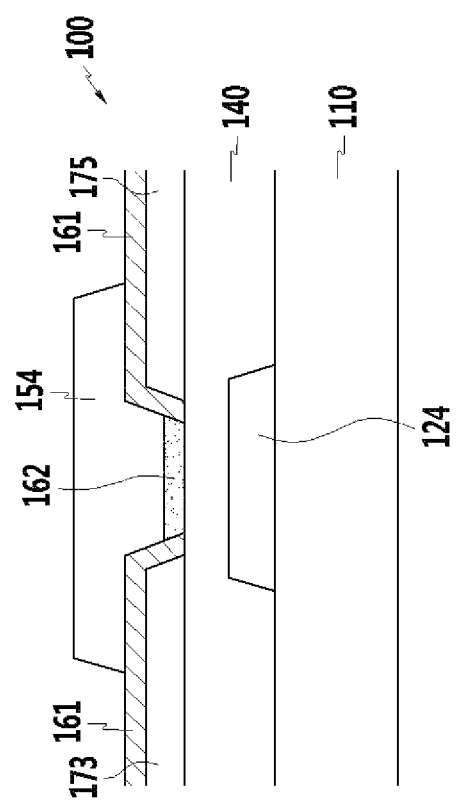
FIG. 1 is a cross-sectional view of an organic thin film transistor according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, an organic thin film transistor according to example embodiments is described.

FIG. 1 is a cross-sectional view of an organic thin film transistor according to example embodiments.

A gate electrode 124 is disposed on a substrate 110 made of, for example, transparent glass, silicon, or plastic.

The gate electrode 124 is connected to a gate line (not shown) that is configured to transfer a gate signal. The gate electrode 124 may be a metal such as molybdenum (Mo), but example embodiments are not limited thereto.

A gate insulator 140 is disposed on the gate electrode 124.

The gate insulator 140 may be made of an organic material, an inorganic material, or a combination thereof. The organic material may include a soluble polymer compound such as a polyvinyl alcohol-based compound, a polyimide-based compound, a polyacryl-based compound, a polystyrene-based compound, benzocyclobutane (BCB), and the like, and the inorganic material may include silicon nitride ($SiN_x$), aluminum oxide ($Al_2O_3$), and silicon dioxide ($SiO_2$). The gate insulator 140 may be a single layer or a stacked layer of two or more thereof.

A source electrode 173 and a drain electrode 175 are disposed on the gate insulator 140.

The source electrode 173 and drain electrode 175 face each other at the center of the gate electrode 124. The source electrode 173 is electrically connected to a data line (not shown) transferring to a data signal.

The source electrode 173 and drain electrode 175 may include at least one metal selected from gold (Au), copper (Cu), nickel (Ni), silver (Ag), aluminum (Al), molybdenum (Mo), chromium (Cr), tantalum (Ta), titanium (Ti), and alloys thereof.

A first self-assembled monolayer 161 is disposed on each of the source electrode 173 and drain electrode 175.

The first self-assembled monolayer 161 may be made of a self-assembled monolayer precursor (hereinafter referred to as 'first self-assembled monolayer precursor') including one end or both ends thereof having an affinity for a metal.

The first self-assembled monolayer precursor may include, for example, a thiol-based compound, a thioacetyl-based compound, a disulfide-based compound, or a combination thereof.

For example, the first self-assembled monolayer precursor may be a compound represented by the following Group 1, but is not limited thereto.

[Group 1]

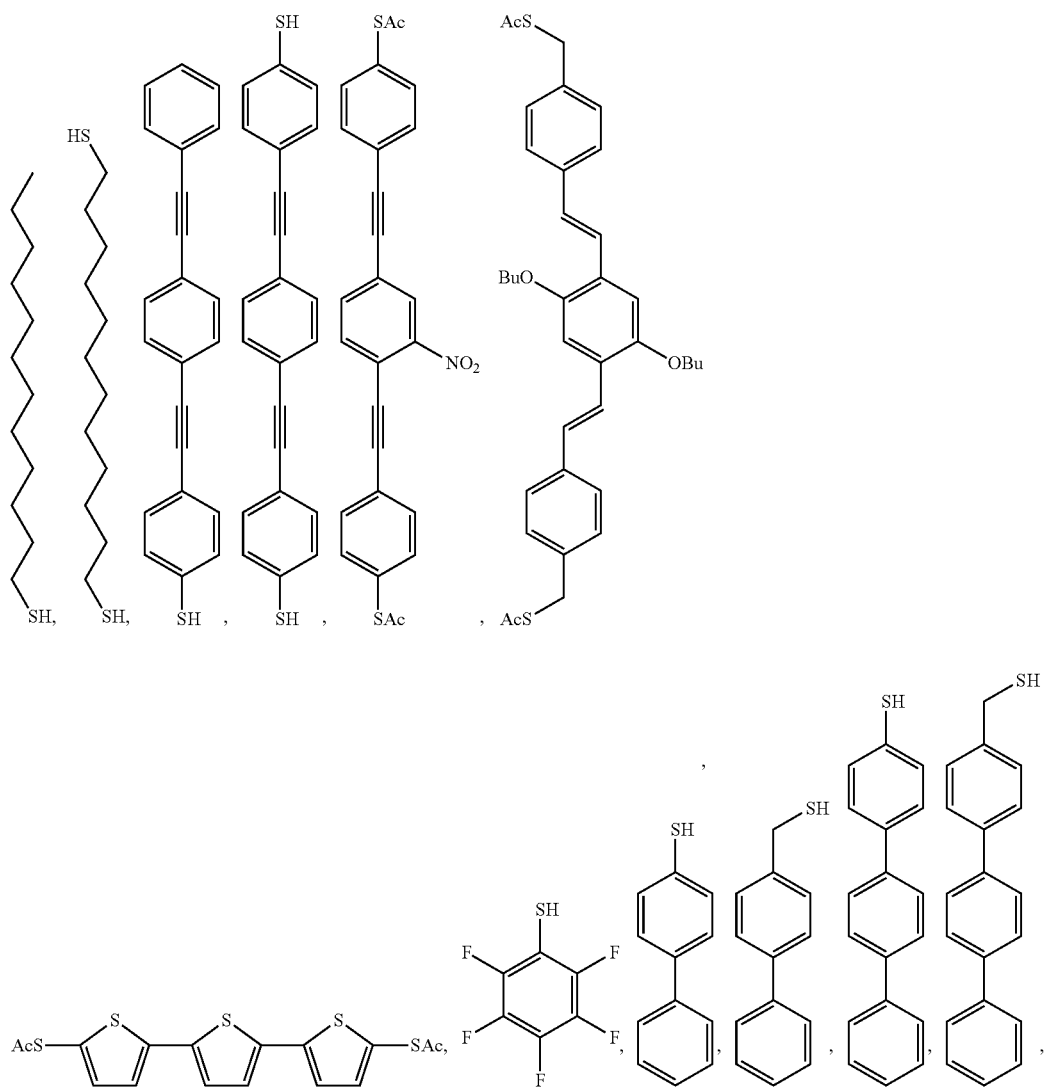

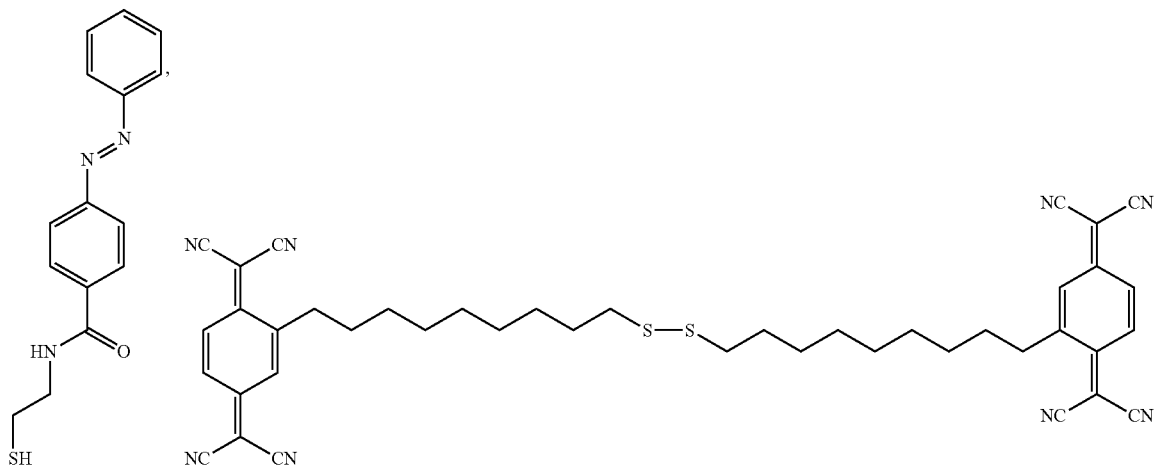

The first self-assembled monolayer precursor may include, for example, a fluorine-containing thiol-based compound such as pentafluorobenzenethiol shown in Group 1.

A second self-assembled monolayer 162 is disposed on the gate insulator 140 exposed between the source electrode 173 and the drain electrode 175.

The second self-assembled monolayer 162 may be made of a self-assembled monolayer precursor (hereinafter referred to as 'second self-assembled monolayer precursor') including one end or both ends thereof having an affinity for the insulator. The second self-assembled monolayer precursor may be made of a different material from the first self-assembled monolayer precursor.

The second self-assembled monolayer precursor may include, for example, a compound represented by the following Chemical Formula 1.

   [Chemical Formula 1]

In Chemical Formula 1, X may be $-SiX_1X_2X_3$, $-COOH$, $-SOOH$, $-PO_5H$, $-SO_3H_2$, $-COCl$, $-PO_3H$, $-SO_2Cl$, $-OPOCl_2$, $-POCl_2$, or a combination thereof, wherein $X_1$, $X_2$, and $X_3$ are each independently hydrogen, a substituted or unsubstituted C1 to C20 alkoxy group, a hydroxy group, or a halogen atom.

In Chemical Formula 1, Y may be $-(CH_2)_n-$ (n is an integer of 0 to 30) or $-(CF_2)_m-$ (m is an integer of 0 to 30), or a combination thereof. For example, n may be an integer of 0 to 30, and/or 1 to 30.

In Chemical Formula 1, Z may be hydrogen, a hydroxy group, a substituted or unsubstituted C1 to C20 alkyl group, a substituted or unsubstituted C6 to C20 aryl group, a substituted or unsubstituted C1 to C20 haloalkyl group, a halogen atom, a thiol group, an amine group, a nitro group, or a combination thereof.

For example, the second self-assembled monolayer precursor may be a compound represented by the following Group 2, but is not limited thereto.

[Group 2]

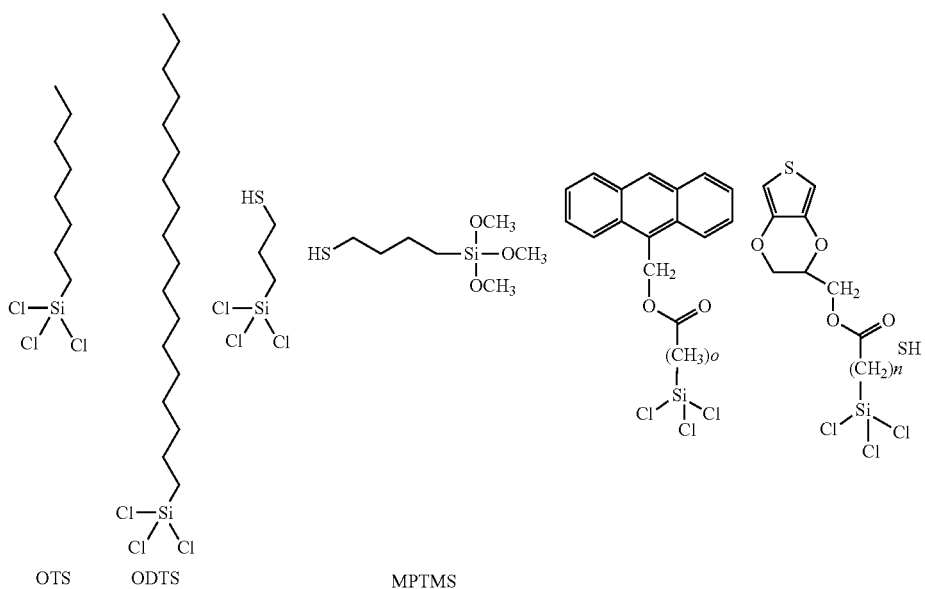

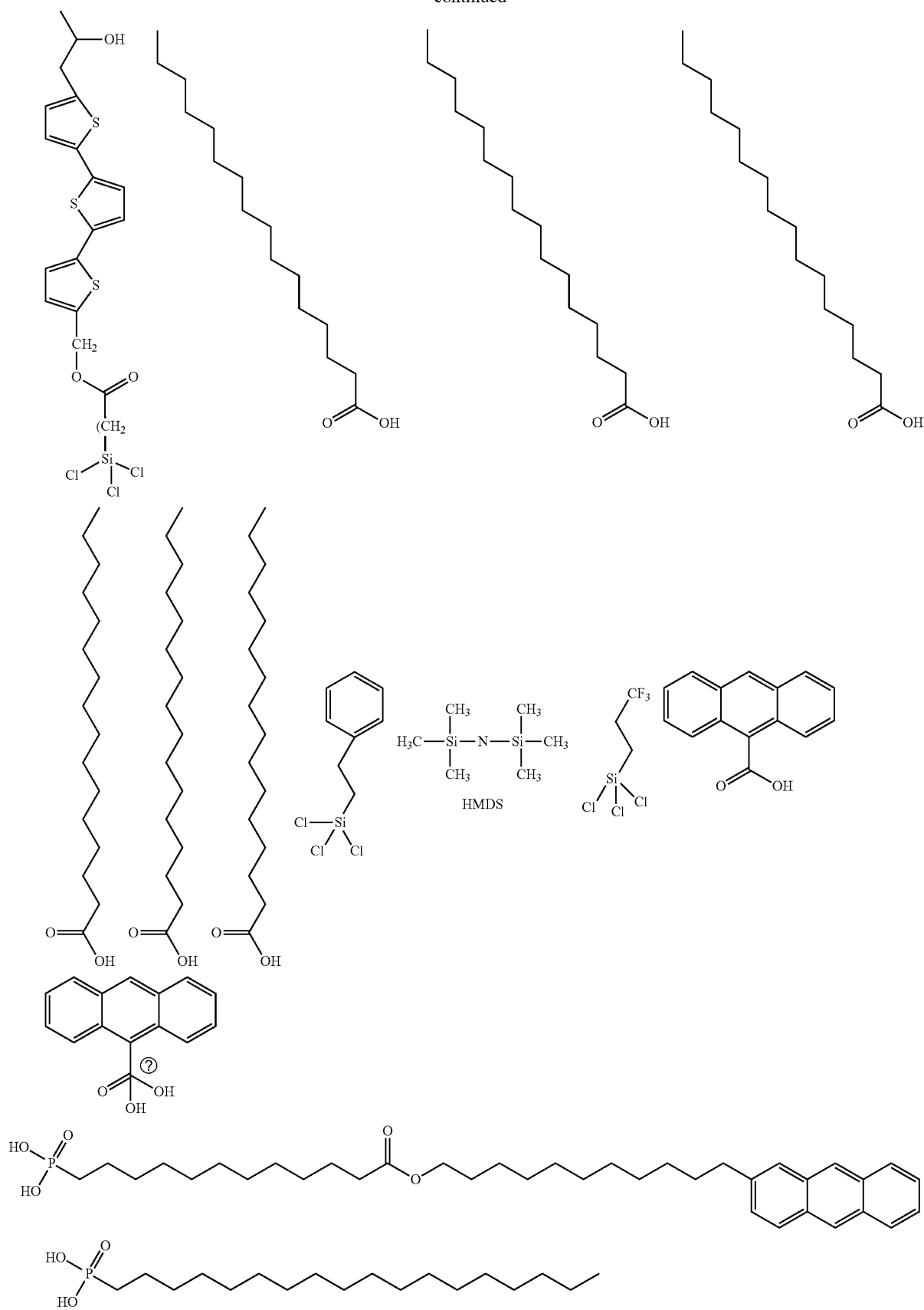

An organic semiconductor 154 is disposed on the source electrode 173, drain electrode 175, and gate insulator 140.

The organic semiconductor 154 may be made of at least one selected from pentacene and a precursor thereof, tetrabenzoporphyrin and a derivative thereof, polyphenylene vinylene and a derivative thereof, polyfullerene and a derivative thereof, polythienylene vinylene and a derivative thereof, polythiophene and a derivative thereof, polythiazole and a derivative thereof, polythienothiophene and a derivative thereof, polyarylamine and a derivative thereof, phthalocyanine and a derivative thereof, metallized phthalocyanine and a halogenated derivative, perylene tetracarboxylic acid dianhydride (PTCDA), naphthalene tetracarboxylic acid dianhydride (NTCDA) or an imide derivative, perylene, or coronene and derivatives thereof including a substituent, and copolymers thereof.

The first self-assembled monolayer 161 may play a role of a charge injecting layer between the organic semiconductor 154 and the source electrode 173 and between the organic semiconductor 154 and the drain electrode 175, so as to decrease the contact resistance therebetween and to increase the charge carrier mobility.

The second self-assembled monolayer 162 is disposed between the organic semiconductor 154 and the gate insulator 140 to improve the molecular arrangement degree of the organic semiconductor material and to decrease defects of the region where the channel of thin film transistor is formed, so as to improve the charge carrier mobility.

Hereinafter, a method of manufacturing an organic thin film transistor according to example embodiments is described with reference to FIG. 2 to FIG. 10 together with FIG. 1.

Figure 2:
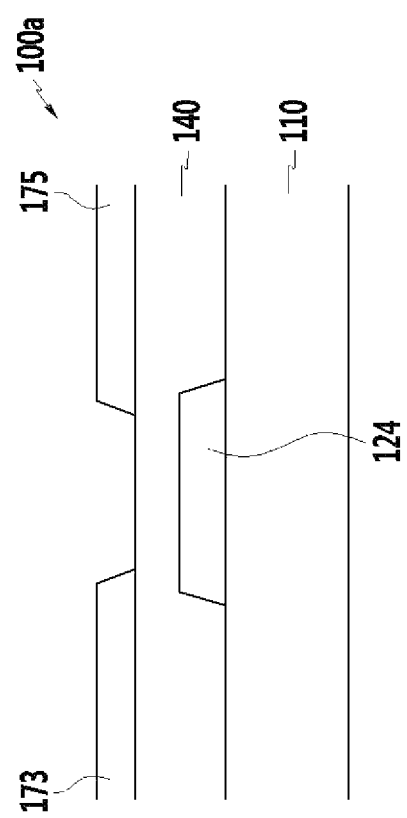
FIGS. 2 and 3 are schematic views showing a method of manufacturing the organic thin film transistor depicted in FIG. 1.
Figure 3:
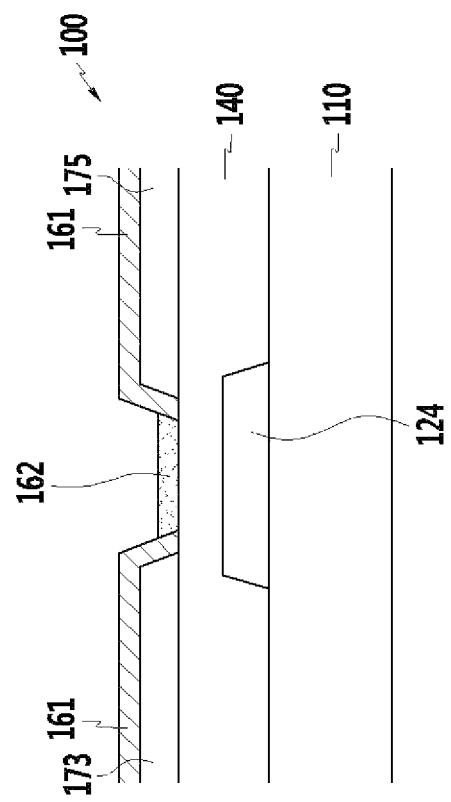

FIGS. 2 and 3 are schematic views showing a method of manufacturing the organic thin film transistor depicted in FIG. 1, and FIGS. 4 to 10 are schematic views showing a method of forming the first self-assembled monolayer and the second self-assembled monolayer.

First, referring to FIG. 2, a conductive layer is formed on a substrate 110 by a method such as sputtering and undergoes a photolithography process to provide a gate electrode 124. Then a gate insulator 140 is provided on the gate electrode 124 by a method of, for example, spin coating or chemical vapor deposition (CVD). Subsequently, a conductive layer is formed on the gate insulator 140 by a method such as sputtering and undergoes the photolithography process to provide a source electrode 173 and a drain electrode 175.

Then the surface of the gate insulator 140, source electrode 173, and drain electrode 175 may be pre-treated. The pretreatment is to activate the surface of the gate insulator 140, source electrode 173, and drain electrode 175 to easily react with the following precursors of the first self-assembled monolayer 161 and the second self-assembled monolayer 162. The pre-treatment may be omitted.

Referring to FIG. 3, a first self-assembled monolayer 161 is provided on the source electrode 173 and the drain electrode 175, and a second self-assembled monolayer 162 is provided on the gate insulator 140. The first self-assembled monolayer 161 and the second self-assembled monolayer 162 may be simultaneously or sequentially provided in a single container (one-pot method). This will be described hereinafter.

As shown in FIG. 1, an organic semiconductor 154 is provided on the first self-assembled monolayer 161 and the second self-assembled monolayer 162. The organic semiconductor 154 may be provided according to a dry process such as thermal evaporation or a solution process such as spin coating and Inkjet printing.

Hereinafter, a method of providing the first self-assembled monolayer 161 and the second self-assembled monolayer 162 is described.

Figure 4:
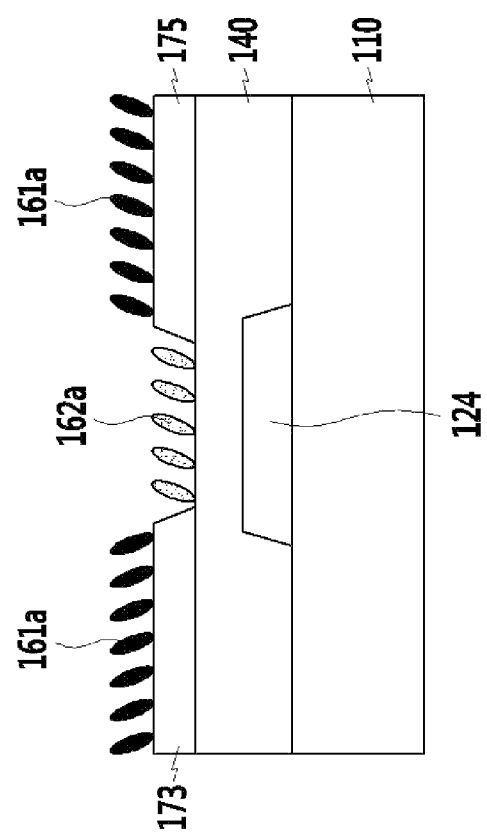
FIGS. 4 to 10 are schematic views showing a method of forming a first self-assembled monolayer and a second self-assembled monolayer.

The first self-assembled monolayer 161 and the second self-assembled monolayer 162 may be simultaneously or sequentially provided in a single container. Referring to FIG. 4, when a first self-assembled monolayer precursor 161a together with a second self-assembled monolayer precursor 162a is provided on the source electrode 173, the drain electrode 175, and the gate insulator 140, each of the first self-assembled monolayer precursor 161a and the second self-assembled monolayer precursor 162a may be self-aligned to dispose the first self-assembled monolayer precursor 161a on the source electrode 173 and the drain electrode 175 and to dispose the second self-assembled monolayer precursor 162a on the gate insulator 140.

As stated above, the first self-assembled monolayer 161 and the second self-assembled monolayer 162 may be simultaneously or sequentially provided in a single container to simplify the process. In addition, when the first self-assembled monolayer 161 and the second self-assembled monolayer 162 are respectively provided in separate steps, the precursor of the second self-assembled monolayer 162 might be first reacted on the metal oxide formed at the surface of the source electrode 173 and the drain electrode 175 by the pretreatment, but this may be mitigated (and/or prevented) according to example embodiments.

The method of simultaneously providing the first self-assembled monolayer 161 and the second self-assembled monolayer 162 may include providing a mixed solution of the first self-assembled monolayer precursor 161a and the second self-assembled monolayer precursor 162a on the source electrode 173, the drain electrode 175, and the gate insulator 140.

The mixed solution may include the first self-assembled monolayer precursor 161a, the second self-assembled monolayer precursor 162a, and a solvent.

The first self-assembled monolayer precursor 161a and the second self-assembled monolayer precursor 162a may be included in the same concentration or in different concentrations. For example, when the first self-assembled monolayer precursor 161a has a different reaction speed than the second self-assembled monolayer precursor 162a, the precursor having the faster reaction speed may have a lower concentration than a concentration of the precursor having the slower reaction speed.

The solvent is not particularly limited as long as it may simultaneously dissolve the first self-assembled monolayer precursor 161a and the second self-assembled monolayer precursor 162a. Examples thereof may include hexane, cyclohexane, toluene, xylene, mesitylene, and combinations thereof.

The mixed solution may be prepared by mixing the first self-assembled monolayer precursor 161a and the second self-assembled monolayer precursor 162a in one solvent, or by dissolving the first self-assembled monolayer precursor 161a and the second self-assembled monolayer precursor 162a in each solvent, respectively, and then mixing the same.

The mixed solution may be provided on the source electrode, the drain electrode, and the gate insulator by a method such as dipping.

Figure 5:
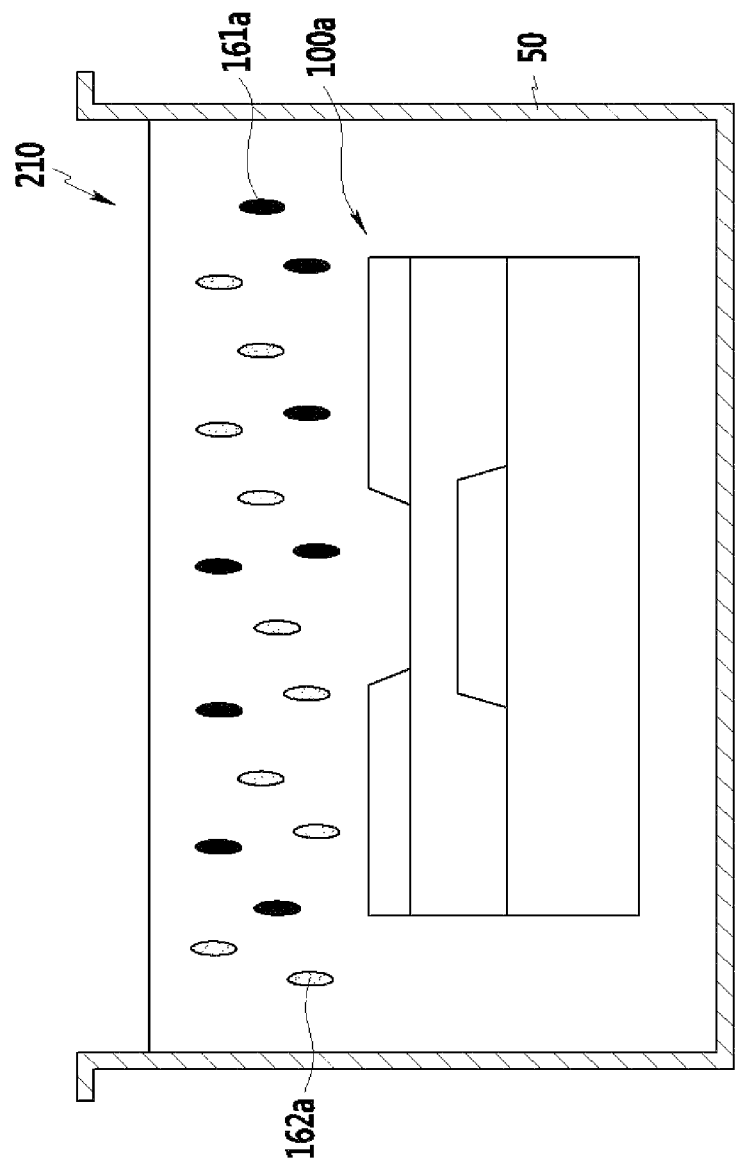

FIG. 5 is a schematic view showing the example of simultaneously providing the first self-assembled monolayer 161 and the second self-assembled monolayer 162 by dipping.

Referring to FIG. 5, the mixed solution 210 is filled in a single container 50, and a stacked structure 100a formed with the source electrode 173, the drain electrode 175, and the gate insulator 140 depicted in FIG. 2 is dipped in the mixed solution 210.

Thereby, as shown in FIG. 4, the first self-assembled monolayer precursor 161a may be self-aligned on the source electrode 173 and the drain electrode 175, and the second self-assembled monolayer precursor 162a may be self-aligned on the gate insulator 140.

The providing of the mixed solution 210 on the source electrode 173, the drain electrode 175, and the gate insulator 140 may be performed by a method of, for example, spin coating. For example, the mixed solution 210 may be spin-coated on the source electrode, the drain electrode, and the gate insulator and dried. Thereby, by self-aligning the first self-assembled monolayer precursor 161a and the second self-assembled monolayer precursor 162a, the first self-assembled monolayer may be disposed on the source electrode and the drain electrode, and the second self-assembled monolayer may be disposed on the gate insulator.

The method of simultaneously providing the first self-assembled monolayer 161 and the second self-assembled monolayer 162 may include simultaneously providing the first self-assembled monolayer precursor and the second self-assembled monolayer precursor in a form of vapor (gas phase) on the source electrode 173, the drain electrode 175, and the gate insulator 140.

Figure 6:
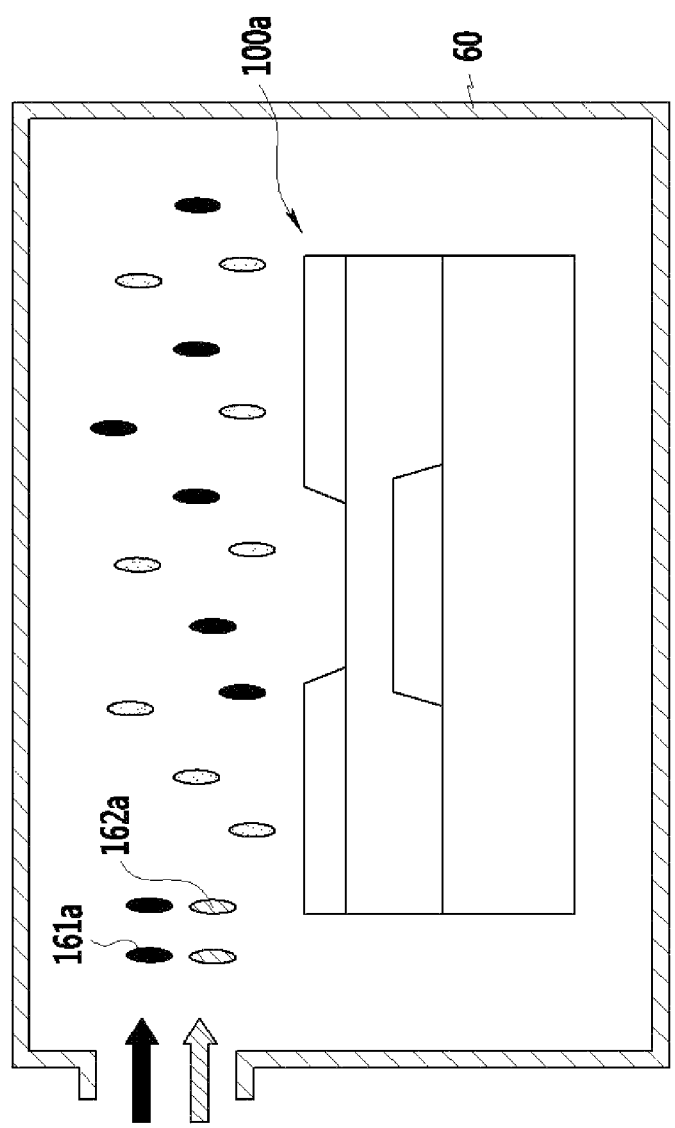

FIG. 6 is a schematic view showing a method of simultaneously providing the first self-assembled monolayer 161 and the second self-assembled monolayer 162 according to vapor deposition.

Referring to FIG. 6, after disposing a stacked structure 100a formed with the source electrode, the drain electrode, and the gate insulator depicted in FIG. 2 in a single container 60 such as a chamber, a vapor of the first self-assembled monolayer precursor 161a and the second self-assembled monolayer precursor 162a may be simultaneously provided thereon.

The providing of the vapor may include, as examples: providing a gasified vapor at room temperature under room pressure; heating the first self-assembled monolayer precursor 161a and the second self-assembled monolayer precursor 162a to generate a vapor and using the vapor; or using a vapor gasified in a vacuum chamber, but is not limited thereto. Thereby, as shown in FIG. 4, the first self-assembled monolayer precursor 161a may be self-aligned on the source electrode 173 and the drain electrode 175, and the second self-assembled monolayer precursor 162a may be self-aligned on the gate insulator 140.

The first self-assembled monolayer 161 and the second self-assembled monolayer 162 may be sequentially formed in a single container. In other words, either one of the first self-assembled monolayer precursor 161a and the second self-assembled monolayer precursor 162a is first provided on the source electrode 173, the drain electrode 175, and the gate insulator 140, and then the other one of the first self-assembled monolayer precursor 161a and the second self-assembled monolayer precursor 162a is provided thereon. Then, according to the self-alignment of the first self-assembled monolayer precursor 161a and the second self-assembled monolayer precursor 162a, the first self-assembled monolayer precursor 161a may be self-aligned on the source electrode 173 and the drain electrode 175, and the second self-assembled monolayer precursor 162a may be self-aligned on the gate insulator 140.

The method of sequentially providing the first self-assembled monolayer 161 and the second self-assembled monolayer 162 may include providing a first solution including either one of the first self-assembled monolayer precursor and the second self-assembled monolayer precursor on the source electrode, the drain electrode, and the gate insulator, and providing a second solution in which the other of the first self-assembled monolayer precursor and the second self-assembled monolayer precursor is further added to the first solution on the source electrode, the drain electrode, and the gate insulator.

The providing of a first solution and a second solution on the source electrode, the drain electrode, and the gate insulator may be performed by, for example, dipping.

Figure 7:
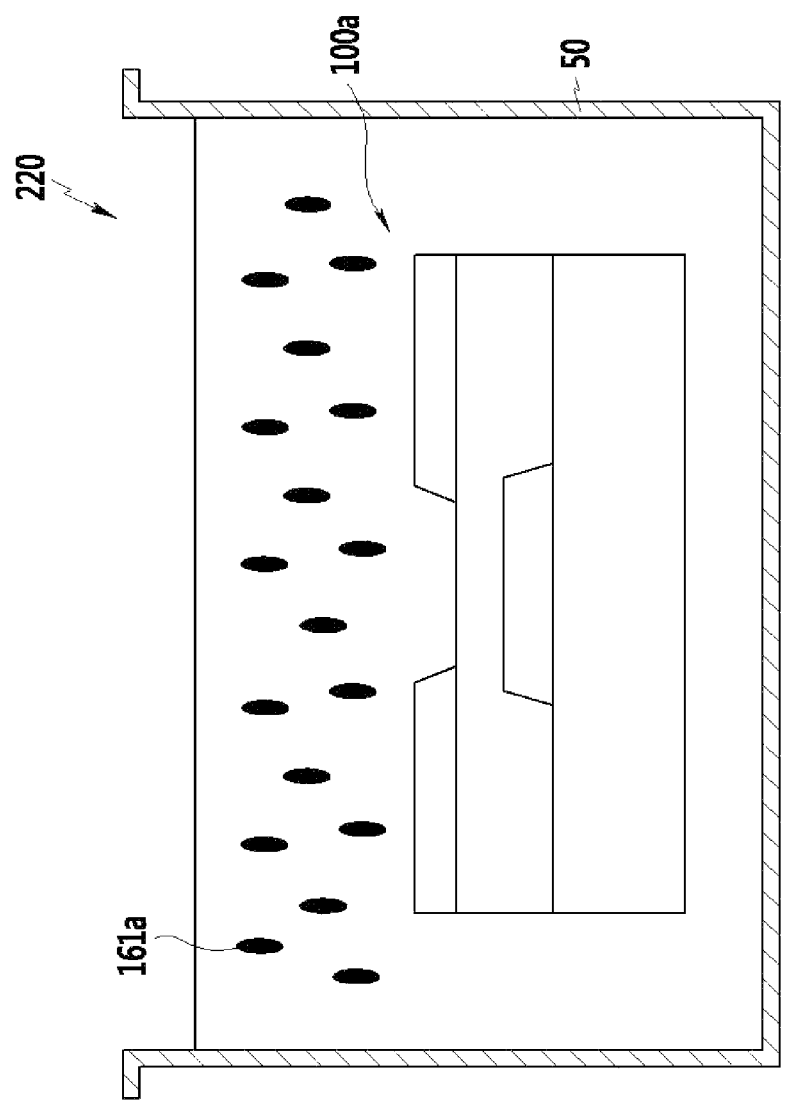
Figure 8:
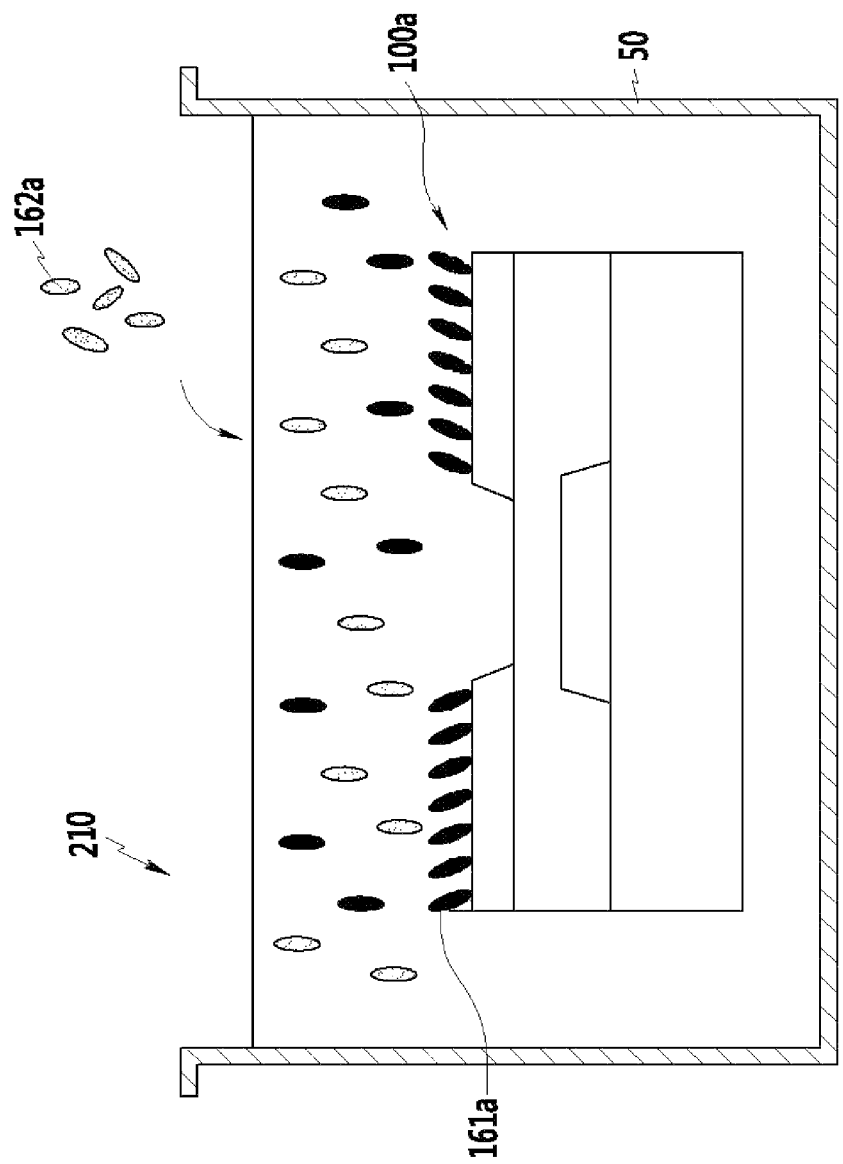

FIG. 7 and FIG. 8 are schematic views showing an example of a method of sequentially providing the first self-assembled monolayer 161 and the second self-assembled monolayer 162.

Referring to FIG. 7, a first solution 220 including the first self-assembled monolayer precursor 161a is filled in a single container 50, and a stacked structure 100a formed with the source electrode 173, the drain electrode 175, and the gate insulator 140 is dipped in the first solution 220. Thereby, the first self-assembled monolayer precursor 161a may be self-aligned on the source electrode 173 and the drain electrode 175.

Then, referring to FIG. 8, when a second self-assembled monolayer precursor 162a is further added to the first solution 220 to form a mixed solution 210 containing both first self-assembled monolayer precursor 161a and the second self-assembled monolayer precursor 162a. The second self-assembled monolayer precursor 162a may be self-aligned on the gate insulator 140.

FIG. 7 and FIG. 8 show the example of first providing the first self-assembled monolayer precursor 161a and then further providing the second self-assembled monolayer precursor 162a, but it is not limited thereto. That is, the second self-assembled monolayer precursor 162a may be first provided and then the first self-assembled monolayer precursor 161a may be further provided.

Another example of a method of sequentially providing the first self-assembled monolayer 161 and the second self-assembled monolayer 162 may include providing either one of the first self-assembled monolayer precursor and the second self-assembled monolayer precursor on the source electrode, the drain electrode, and the gate insulator, and then providing the other of the first self-assembled monolayer precursor and the second self-assembled monolayer precursor on the source electrode, the drain electrode, and the gate insulator.

The providing of the first self-assembled monolayer precursor and the second self-assembled monolayer precursor on the source electrode, the drain electrode, and the gate insulator may be performed by, for example, spin coating. For example, either one of the first self-assembled monolayer precursor and the second self-assembled monolayer precursor is spin-coated in a form of a liquid on the source electrode, the drain electrode, and the gate insulator and then dried. Then a liquid of the other of the first self-assembled monolayer precursor and the second self-assembled monolayer precursor is spin-coated thereon and dried. However, a solution in which a solid-phased precursor is dissolved in a solvent may be used instead of the liquid-phased precursor.

A further example of a method of sequentially providing the first self-assembled monolayer 161 and the second self-assembled monolayer 162 may include providing a vapor of either one of the first self-assembled monolayer precursor and the second self-assembled monolayer precursor on the source electrode 173, the drain electrode 175, and the gate insulator 140, and providing a vapor of the other of the first self-assembled monolayer precursor and the second self-assembled monolayer precursor on the source electrode 173, the drain electrode 175, and the gate insulator 140.

Figure 9:
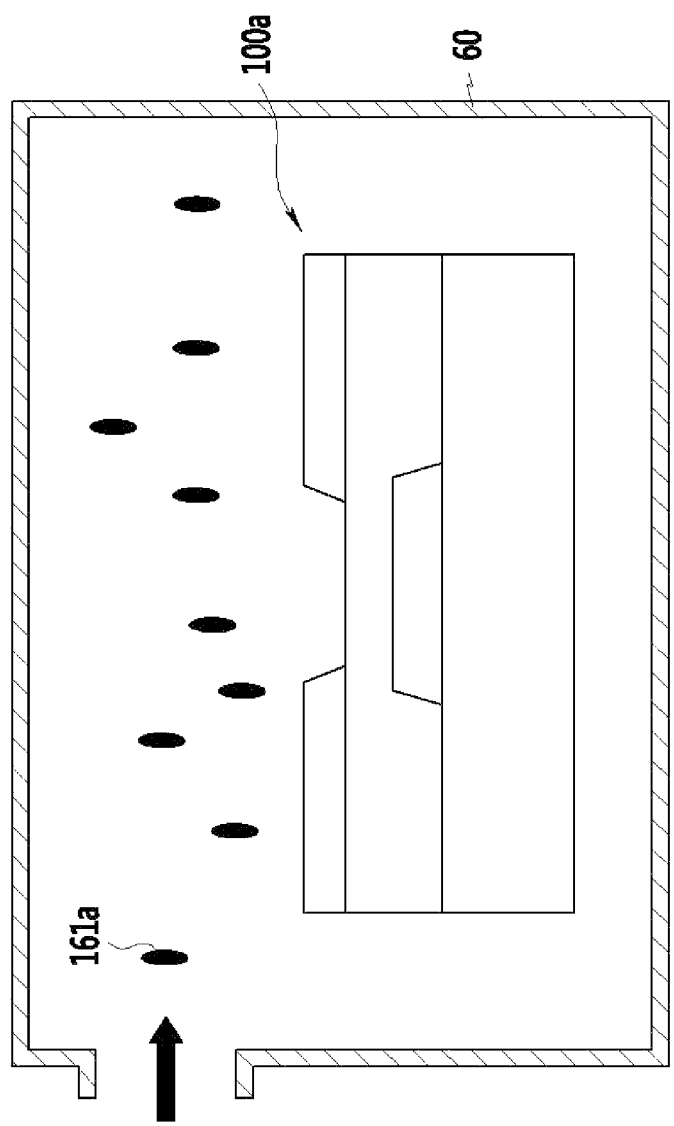
Figure 10:
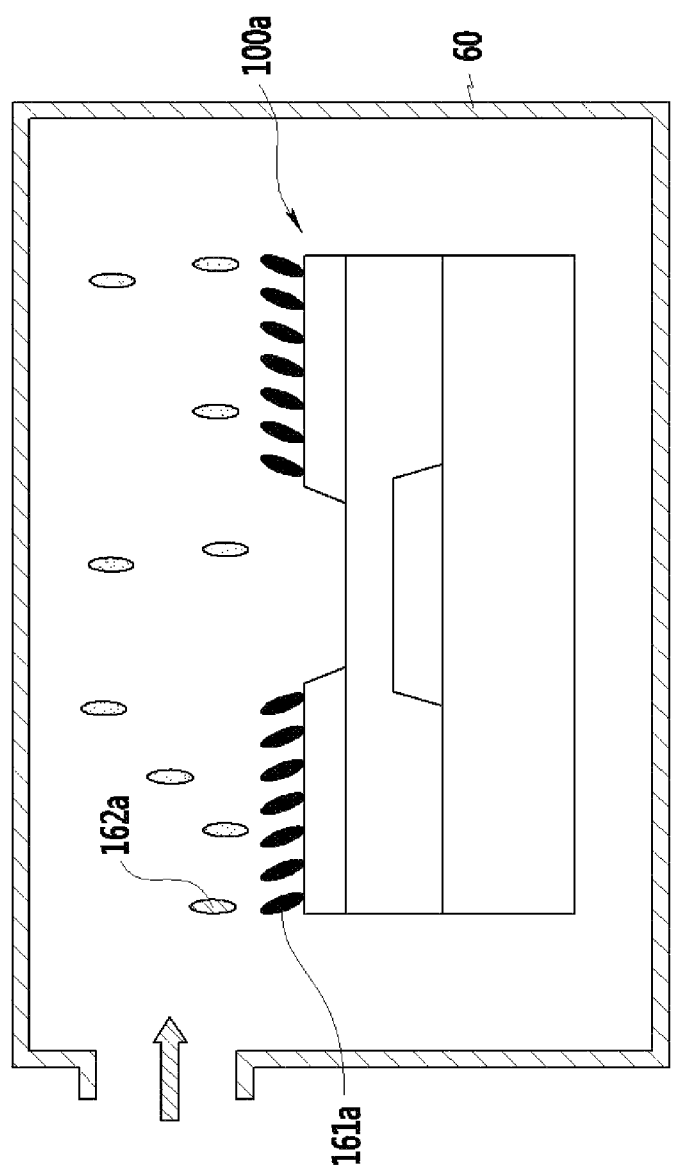

FIG. 9 and FIG. 10 are schematic views showing an example of a method of sequentially providing the first self-assembled monolayer 161 and the second self-assembled monolayer 162 according to vapor deposition.

Referring to FIG. 9, the stacked structure 100a formed with the source electrode 173, the drain electrode 175, and the gate insulator 140 is disposed in a single container 60 such as a chamber, and then the first self-assembled monolayer precursor 161a is provided in a vapor phase thereto. Thereby, the first self-assembled monolayer precursor 161a may be self-aligned on the source electrode 173 and the drain electrode 175.

Then referring to FIG. 10, the vapor-phased second self-assembled monolayer precursor 162a is continuously provided into the single container 60. Thereby, the second self-assembled monolayer precursor 162a may be self-aligned on the gate insulator 140.

In FIG. 9 and FIG. 10, the second self-assembled monolayer precursor 162a is exemplarily provided after providing the first self-assembled monolayer precursor 161a, but it is not limited thereto. That is, the second self-assembled monolayer precursor 162a may be first provided and then the first self-assembled monolayer precursor 161a may be provided.

As described above, by simultaneously or sequentially providing the first self-assembled monolayer to be disposed on the source electrode and the drain electrode and the second self-assembled monolayer to be disposed on the gate insulator in a single container, the process may be simplified, the contact resistance between the organic semiconductor and the metal electrode may be decreased, and the channel characteristic may be improved.

The organic thin film transistor may be applied to various display devices. The display device may be, for example, a liquid crystal display (LCD), an organic light emitting diode (OLED) display, an electrophoretic display, and the like, but is not limited thereto.

Hereinafter, this disclosure is illustrated in further detail with reference to examples. However, the examples are non-limiting embodiments.

Manufacturing Organic Thin Film Transistor

Example 1

Molybdenum (Mo) is formed on a glass substrate by sputtering and is patterned to provide a gate electrode. A silicon oxide layer is formed on the gate electrode by chemical vapor deposition (CVD) in a thickness of 300 nm to provide a gate insulator, and a source electrode and a drain electrode are provided thereon using gold (Au).

Subsequently, 1 mmol of pentafluorobenzenethiol (PFBTh) and 5 mmol of octadecyltrichlorosilane (ODTS) are dissolved in 1000 ml of toluene to provide a mixed solution.

Then the substrate formed with the gate insulator, the source electrode, and the drain electrode is dipped in the mixed solution for 40 minutes and removed therefrom and cleaned using ethanol. It is heated at 120° C. to provide a self-assembled monolayer made of pentafluorobenzenethiol on the source electrode and the drain electrode and to provide a self-assembled monolayer made of octadecyltrichlorosilane on the gate insulator.

Then poly(didodecyl-quarterthiophene-alt-didodecyl-bithiazole) is Inkjet printed on the self-assembled monolayers and dried to provide an organic semiconductor.

Example 2

An organic thin film transistor is fabricated in accordance with the same procedure as in Example 1, except that the mixed solution is prepared by including pentafluorobenzenethiol (PFBTh) and octadecyltrichlorosilane (ODTS) each at 5 mmol.

Example 3

An organic thin film transistor is fabricated in accordance with the same procedure as in Example 1, except that the mixed solution is prepared by including pentafluorobenzenethiol (PFBTh) and octadecyltrichlorosilane (ODTS) at 10 mmol and 5 mmol, respectively.

Comparative Example 1

An organic thin film transistor is fabricated in accordance with the same procedure as in Example 1, except that the self-assembled monolayer is disposed only on the gate insulator by using a 5 mmol solution of octadecyltrichlorosilane (ODTS) instead of the mixed solution.

Comparative Example 2

An organic thin film transistor is fabricated in accordance with the same procedure as in Example 1, except that a self-assembled monolayer is first provided on the gate insulator by using a solution including octadecyltrichlorosilane (ODTS) at 5 mmol and then a self-assembled monolayer is provided on the source electrode and the drain electrode by using a solution of pentafluorobenzenethiol (PFBTh) at 1 mmol instead of simultaneously providing the self-assembled monolayer on the gate insulator, the source electrode, and the drain electrode using the mixed solution.

Evaluation 1

Each organic thin film transistor according to Examples 1 to 3 and Comparative Examples 1 and 2 is evaluated for the contact angle characteristic.

The contact angle characteristic is evaluated using DSA10 instruments (manufactured by Krüss GmbH) according to a static sessile drop method.

The results are shown in Table 1.

TABLE 1

|  | Source electrode (drain electrode) (Au) |
| --- | --- |
| Example 1 | 75.4° |
| Example 2 | 80.2° |
| Example 3 | 86.0° |
| Comparative Example 1 | 99.2° |
| Comparative Example 2 | 86.7° |

Referring to Table 1, it is understood that the organic thin film transistors according to Examples 1 to 3 have lower contact angles than the organic thin film transistors according to Comparative Examples 1 and 2.

Evaluation 2

Each organic thin film transistor according to Examples 1 to 3 and Comparative Examples 1 and 2 is evaluated for charge carrier mobility. The charge carrier mobility is evaluated using a semiconductor analyzer (4200-SCS, manufactured by Keithley Instruments Inc.).

The results are shown in Table 2.

TABLE 2

|  | Charge carrier mobility (cm$^2$/Vs) |
| --- | --- |
| Example 1 | 0.255 |
| Example 2 | 0.263 |
| Example 3 | 0.251 |
| Comparative Example 1 | 0.258 |
| Comparative Example 2 | 0.272 |

Referring to Table 2, it is understood that the organic thin film transistors according to Examples 1 to 3 have similar charge carrier mobilities to the organic thin film transistors according to Comparative Examples 1 and 2. From the results, it is confirmed that the organic thin film transistors according to Examples 1 to 3 affect the charge carrier mobility little while simplifying the process.

Evaluation 3

Each organic thin film transistor according to Example 2 and Comparative Examples 1 and 2 is evaluated for a contact resistance (ohmic contact) characteristic.

The contact resistance is evaluated using a semiconductor analyzer (4200-SCS, manufactured by Keithley Instruments Inc.).

Figure 11:
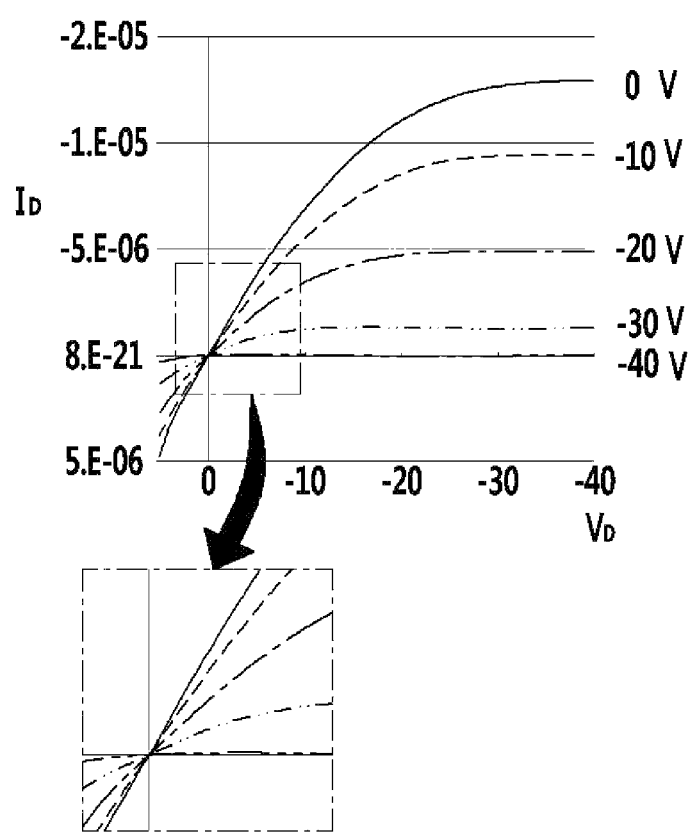
FIGS. 11 to 13 are graphs showing contact resistance of organic thin film transistors according to Example 2 and Comparative Examples 1 and 2, respectively.
Figure 12:
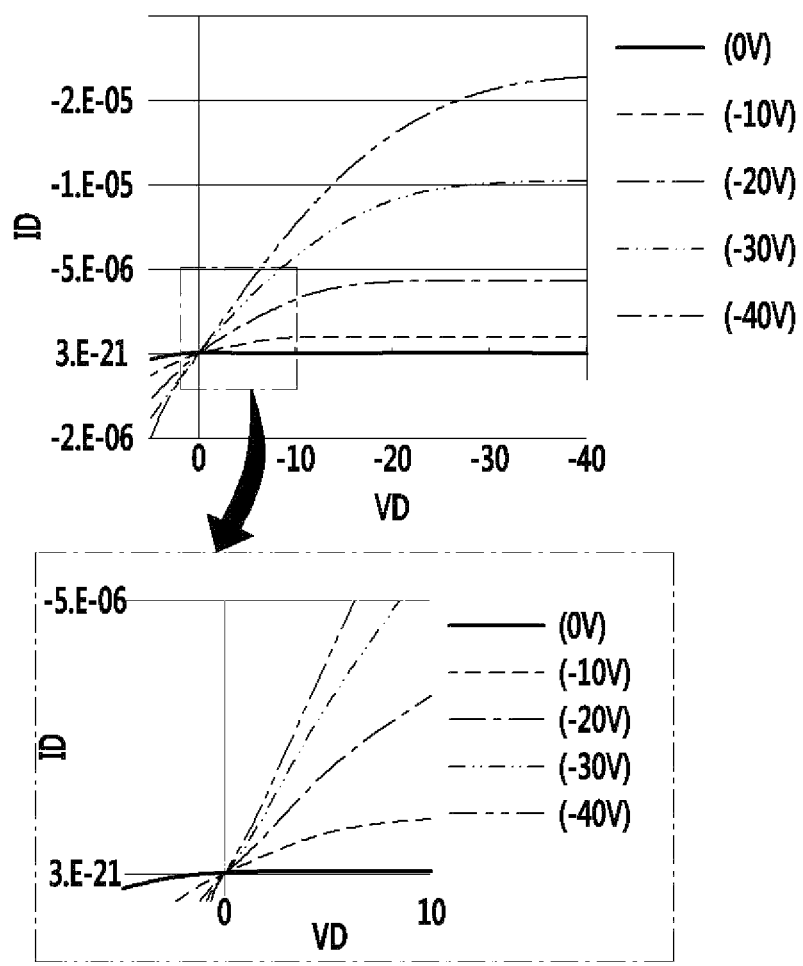
Figure 13:
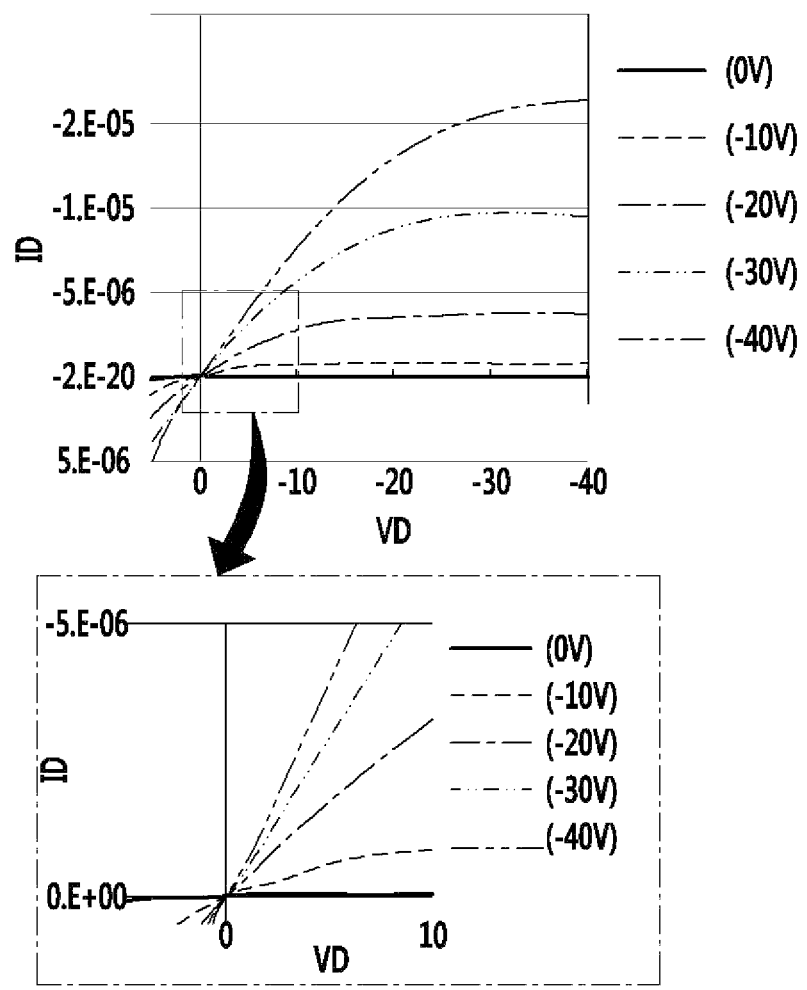

FIGS. 11 to 13 are graphs showing contact resistance of organic thin film transistors according to Example 2 and Comparative Examples 1 and 2, respectively.

Referring to FIG. 11 to FIG. 13, it is confirmed that the organic thin film transistor according to Example 2 has excellent contact resistance compared to the organic thin film transistors according to Comparative Examples 1 and 2.

While some example embodiments have been particularly shown and described, it will be understood by one of ordinary skill in the art that variations in form and detail may be made therein without departing from the spirit and scope of the claims.

What is claimed is:

1. A method of manufacturing an organic thin film transistor, comprising:
    sequentially forming a gate electrode, a gate insulator, and source and drain electrodes on a substrate;
    forming a first self-assembled monolayer on the source electrode and the drain electrode from a first self-assembled monolayer precursor;
    forming a second self-assembled monolayer on the gate insulator from a second self-assembled monolayer precursor,
        the second self-assembled monolayer precursor being a different material than a material of the first self-assembled monolayer precursor,
        the forming a first self-assembled monolayer and the forming a second self-assembled monolayer being performed simultaneously or sequentially in a single container; and
    forming an organic semiconductor on the first self-assembled monolayer and the second self-assembled monolayer.

2. The method of claim 1, wherein the forming a first self-assembled monolayer and the forming a second self-assembled monolayer comprise:
    coating a mixed solution of the first self-assembled monolayer precursor and the second self-assembled monolayer precursor on the source electrode, the drain electrode, and the gate insulator.

3. The method of claim 2, wherein the coating a mixed solution on the source electrode, the drain electrode, and the gate insulator includes one of dip coating and spin coating.

4. The method of claim 2, wherein the mixed solution contains a different concentration of the first self-assembled monolayer precursor than a concentration of the second self-assembled monolayer precursor.

5. The method of claim 1, wherein the forming a first self-assembled monolayer and the forming a second self-assembled monolayer includes:
    coating a first solution containing one of the first self-assembled monolayer precursor and the second self-assembled monolayer precursor on the source electrode, the drain electrode, and the gate insulator; and
    coating a second solution on the source electrode, the drain electrode, and the gate insulator,
        the second solution containing an other of the first self-assembled monolayer precursor and the second self-assembled monolayer precursor added to the first solution.

6. The method of claim 5, wherein coating a first solution and the coating a second solution on the source electrode, the drain electrode, and the gate insulator are performed by a dipping method.

7. The method of claim 1, wherein the forming a first self-assembled monolayer and the forming a second self-assembled monolayer includes:
    coating one of the first self-assembled monolayer precursor and the second self-assembled monolayer precursor on the source electrode, the drain electrode, and the gate insulator; and
    coating an other of the first self-assembled monolayer precursor and the second self-assembled monolayer precursor on the source electrode, the drain electrode, and the gate insulator.

8. The method of claim 7, wherein the coating an other of the first self-assembled monolayer precursor and the second self-assembled monolayer precursor includes a spin coating method.

9. The method of claim 1, wherein the coating a first self-assembled monolayer and the coating of a second self-assembled monolayer includes:
    simultaneously providing the first self-assembled monolayer precursor and the second self-assembled monolayer precursor in a vapor phase on the gate insulator, the source electrode, and the drain electrode.

10. The method of claim 1, wherein the coating a first self-assembled monolayer and the coating a second self-assembled monolayer comprise:
    providing one of the first self-assembled monolayer precursor and the second self-assembled monolayer precursor in a vapor phase on the gate insulator, the source electrode, and the drain electrode, and
    further providing an other of the first self-assembled monolayer precursor and the second self-assembled monolayer precursor in a vapor phase on the gate insulator, the source electrode, and the drain electrode.

11. The method of claim 1, wherein the first self-assembled monolayer precursor includes one of a thiol-based compound, a thioacetyl-based compound, a disulfide-based compound, and a combination thereof.

12. The method of claim 11, wherein the first self-assembled monolayer precursor includes a fluorine-containing thiol-based compound.

13. The method of claim 1, wherein the second self-assembled monolayer precursor includes a compound represented by the following Chemical Formula 1:

$$X\text{—}Y\text{—}Z \qquad \text{[Chemical Formula 1]}$$

wherein, in Chemical Formula 1,

X is one of —$SiX_1X_2X_3$, —COOH, —SOOH, —$PO_SH$, —$SO_3H_2$, —COCl, —$PO_3H$, —$SO_2Cl$, —$OPOCl_2$, —$POCl_2$, and a combination thereof, $X_1$, $X_2$, and $X_3$ are each independently one of hydrogen, a substituted or unsubstituted C1 to C20 alkoxy group, a hydroxy group, and a halogen atom, Y is one of —$(CH_2)_n$— (n is an integer of 0 to 30) or —$(CF_2)_m$— (m is an integer of 0 to 30), and a combination thereof, and Z is one of hydrogen, a hydroxy group, a substituted or unsubstituted C1 to C20 alkyl group, a substituted or unsubstituted C6 to C20 aryl group, a substituted or unsubstituted C1 to C20 haloalkyl group, a halogen, a thiol group, an amine group, a nitro group, and a combination thereof.

14. An organic thin film transistor manufactured according the method of claim 1.

15. A display device comprising the organic thin film transistor of claim 14.

* * * * *